United States Patent [19]

Suetaki

[11] Patent Number: 5,594,274
[45] Date of Patent: Jan. 14, 1997

[54] LEAD FRAME FOR USE IN A SEMICONDUCTOR DEVICE AND METHOD OF MANUFACTURING THE SEMICONDUCTOR DEVICE USING THE SAME

[75] Inventor: Kenji Suetaki, Tokyo, Japan

[73] Assignee: NEC Corporation, Minato-ku, Japan

[21] Appl. No.: 587,825

[22] Filed: Jan. 11, 1996

Related U.S. Application Data

[63] Continuation of Ser. No. 267,006, Jun. 27, 1994, abandoned.

[30] Foreign Application Priority Data

Jul. 1, 1993 [JP] Japan ..................... 5-163050

[51] Int. Cl.⁶ ................. H01L 23/495; H01L 23/28
[52] U.S. Cl. ................ 257/667; 257/669; 257/676
[58] Field of Search ........................ 257/667, 676, 257/666, 669, 674, 787

[56] References Cited

U.S. PATENT DOCUMENTS 5,045,919  9/1991  Nagaoka ................. 257/676
5,134,458  7/1992  Tsutsumi et al. ......... 257/676

FOREIGN PATENT DOCUMENTS 0062548  4/1982  Japan ................. 257/676
0142767  5/1992  Japan ................. 257/676
0165660  6/1992  Japan ................. 257/667

Primary Examiner—Sara W. Crane
Assistant Examiner—David Ostrowski
Attorney, Agent, or Firm—Laff, Whitesel, Conte & Saret, Ltd.

[57] ABSTRACT

A distance between each two sides adjacent to a first portion X of the outer peripheral portion of an island portion 3 and the inner end of an inner lead portion 4 is set to $d_1$ while the distance between each two sides adjacent to a second portion Y, which is diagonal to the first portion X, and the inner end of the inner lead portion 4 is set to $d_2$ ($<d_1$). The island portion 3 has a portion 2a for placing the semiconductor chip thereon and an overhang portion 3a attached to that portion. A semiconductor chip 2 is adhered on the island portion 3 of the lead frame 10, which is then attached in position within a mold. From a gate 21 a molten resin is injected into the cavity 23 in a diagonal direction of the square island portion, i.e. a direction from the first portion X toward the second portion Y.

12 Claims, 5 Drawing Sheets

LEAD FRAME FOR USE IN A SEMICONDUCTOR DEVICE AND METHOD OF MANUFACTURING THE SEMICONDUCTOR DEVICE USING THE SAME

This application is a continuation of application Ser. No. 08/267,006, filed Jun. 27, 1994, now abandoned.

FIELD OF THE INVENTION

The present invention relates to a lead frame for use in a plastic package type semiconductor device and a method of manufacturing a semiconductor device using the same and, in particular, to ones paying special attention to preventing sealing defects.

BACKGROUND OF THE INVENTION

FIG. 1 is a plan view illustrating a specific example of a conventional lead frame for use in a plastic package type semiconductor device.

The lead frame is repeatedly formed in plural number in an elongated band-shaped member in the longitudinal direction. FIG. 1 illustrates one of the lead frame portions 10. At a substantially central portion of a square frame portion 5, a square island portion 3 supported by a suspension lead 7 is formed, and about the island portion, a plurality of lead members 1 extending from the frame portion 5 toward the island portion 3 and a tie bar 8 for supporting adjacent lead members 1 each at a certain interval are formed. The lead member 1, with respect to the tie bar 8, comprises an internal portion (inner lead portion) 4, which is close to the island portion 3, and an outer portion (outer lead portion) 6, which is close to the frame portion 5, the tip end of the inner lead portion 4 extending to a position spaced apart from the island portion 3 with a predetermined distance.

In order to manufacture the plastic package type semiconductor device utilizing the lead frame, first, as illustrated in FIGS. 2 and 3, a semiconductor chip 2 is adhered on the island portion 3 of the lead frame 10 by means of an adhesive agent to interconnect each electrode pad of the semiconductor chip and the tip end portion of the inner lead portion 4 of the lead member 1 by means of a fine metallic line (bonding wire) 26. Next, the lead frame is attached in position within a mold.

FIG. 2 is a partially cutaway plan view illustrating a positional relationship between the lead frame and a lower mold member. Further, FIG. 3 is a cross-sectional view illustrating a state in which the lead frame is sandwiched by an upper mold member and the lower mold member, corresponding to the cross-section taken along lines III—III of FIG. 2.

The mold comprises an upper mold member 30 and a lower mold member 20, these mold members clamping the lead frame 10 in a sandwiching manner. Thus, a cavity 23 can be formed enveloping the island portion 3, on which the semiconductor chip is attached, and the inner lead portion. That is, a recess portion 25 is formed at the upper surface of the lower mold member 20 and, corresponding thereto, a recess portion 35 is formed at the lower surface of the upper mold member 30, these two recess portions 25, 35 cooperating to form the cavity 23.

At the upper surface of the lower mold member 20, a gate 21 and a runner 22, which are each adapted to inject the resin into the cavity 23, are formed. The gate 21 is provided at a position corresponding to one corner portion of the island portion 3. From the gate the resin may be injected into the cavity 23 in the direction of diagonal line of the square form of the island portion. At a position opposite to the gate 21, an air vent 24 is provided to evacuate air within the cavity as the resin is injected.

Injecting a synthetic sealing resin through the runner 22 and gate 21 into the cavity 23 causes air remaining within the cavity to be evacuated through the air vent due to the action of the injected resin. Thus, the resin is filled within the cavity 23 and, subsequently, by heating the mold, it is hardened. Finally, the mold are open, the tie bar 8 is cut away, the outer lead portion 8 and the suspension lead 7 are cut apart from the frame portion 5 and the resin burrs are removed to obtain the plastic package type, i.e. resin seal type, semiconductor device.

In the foregoing conventional lead frame, the interval between the outer peripheral portion of the island portion 3 and the inner end of the inner lead portion 4 is set substantially equal over the entire outer periphery. Therefore, when being injected from the gate 21 into a lower portion of the cavity 23, i.e. a portion lower than the lead frame 10, the molten resin will evenly flow from the lower portion toward an upper portion of the cavity over the entire periphery (as indicated by arrow in FIG. 3). The resin runs over the lead frame in such a manner of A→B→C→D→E as indicated in FIG. 2. That is, the resin first arrives at A, then B, then C, then D and then E. This is due to the fact that since the area between the semiconductor chip 2 and the upper mold member 30 is narrow, the flow rate of the resin is small, so that, in the neighborhood of the air vent the resin flowing from the lower portion toward the upper portion of the cavity flows back.

As a result, the air, which should originally be extruded by the injected resin, will remain involved at the portion overlying the semiconductor chip 2 within the injectd resin, which in turn will remain as air bubbles therein after hardened, and this residual air bubbles will degrade the reliability of the semiconductor device or its mechanical strength.

SUMMARY OF THE INVENTION

The present invention was made in order to solve the problems inherent to the foregoing conventional technique, and the object of the present invention is to prevent air bubbles from remaining as the semiconductor device is manufactured by adhering the semiconductor chip on the lead frame and sealing it with resin, and to thereby suppress the degradation of the reliability or mechanical strength of the semiconductor device.

The foregoing object can be achieved by a lead frame comprising an island portion for placing a semiconductor chip thereon and a plurality of lead members each extending from a frame portion surrounding the island portion toward the interior thereof, in which the interval between the island portion and the inner end of the lead member is made smaller ranging from a first portion up to a second portion of the outer periphery of the island portion, the second portion is opposite to the first portion.

Further, according to the present invention, there is provided a method of manufacturing a plastic package type semiconductor device comprising steps of:

retaining a lead frame by means of a mold apparatus, the lead frame comprising an island portion for placing a semiconductor chip thereon and a plurality of lead members extending inwardly from a frame portion surrounding the island portion, to thereby form a cavity for enveloping the semiconductor chip, island portion and the inner portion of the lead members; and injecting a molten resin into the cavity from the mold apparatus at a position corresponding to a first portion of the outer periphery of the island portion;

said method further including a step of disposing the lead frame relative to the mold apparatus so that an interval between the island portion and an inner lateral portion of the mold apparatus is made smaller ranging from the first portion to an opposite second portion of the outer periphery of the island portion.

Further, according to the present invention, there is provided a method of manufacturing a plastic package type semiconductor device comprising steps of:

retaining a lead frame by means of a mold apparatus, the lead frame comprising an island portion for placing a semiconductor chip thereon and a plurality of lead members extending inwardly from a frame portion surrounding the island portion, to thereby form a cavity for enveloping the semiconductor chip, island portion and the inner portion of the lead members; and injecting a molten resin into the cavity from the mold apparatus at a position corresponding to a first portion of the outer periphery of the island portion;

the method further including a step of disposing the lead frame relative to the mold apparatus so that a width of an aperture which is defined by the island portion, lead members and an inner lateral portion of the mold apparatus and communicates an upper portion and lower portion of the cavity is made smaller ranging from the first portion up to an opposite second portion of the outer periphery of the island portion.

According to the present invention, since the width of the aperture, i.e. a communicating path, between the upper and lower portions of the cavity, which is defined by the island portion, inner lateral portion of the mold apparatus and lead members, becomes smaller at the downstream side than at the upstream side as regards the direction in which the resin is injected into the cavity of the mold, a substantially uniform resin flow can also be achieved at a portion between the semiconductor chip and the inner lateral surface of mold apparatus along the above direction. As a result, there can be no chance that the air can remain involved above the portion overlying the semiconductor chip, or that after the resin is hardened it can remain in the form of air bubbles within the hardened resin. In consequence, the operational reliability of the semiconductor device can excellently be maintained, and the mechanical strength thereof can also excellently be maintained.

DETAILED DESCRIPTION OF THE PREFERRED EMBODIMENTS

Several specific embodiments are now hereinafter described with reference to the accompanying drawings.

Figure 4:
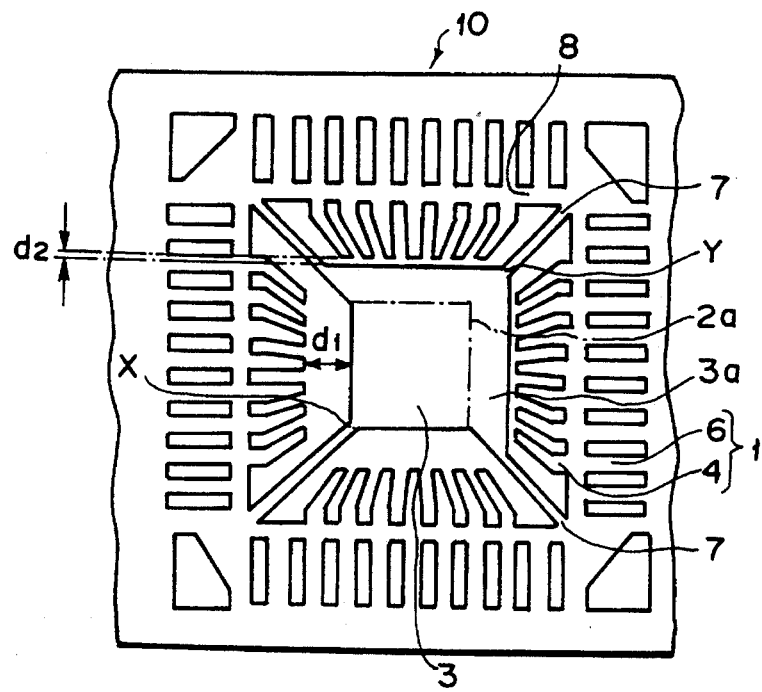
FIG. 4 is a plan view illustrating a first embodiment of a lead frame used in a plastic package type semiconductor device according to the present invention.

FIG. 4 is a plan view illustrating a first embodiment of a lead frame used for the plastic package type semiconductor device according to the present invention.

The lead frame is repeatedly formed in plural number in an elongated band-shaped member in the longitudinal direction. FIG. 4 illustrates one of the lead frame portions 10. At a substantially central portion of a square frame portion 5, a square island portion 3 is formed supported by a suspension lead 7, and about the island portion, a plurality of lead members 1 extending from the frame portion 5 toward the island portion 3 and a tie bar 8 for supporting adjacent lead members 1 each at a certain interval are formed. The lead member 1 comprises an inner portion (inner lead portion) 4 which is close to the island portion 3, and an outer portion (outer lead portion) 5 which is close to the frame portion 5, with respect to the tie bar 8.

Here, it should be noted that, in this embodiment, the distance between each two sides adjacent to a first portion X of the outer peripheral portion of the island portion 3 and the inner end of the inner lead portion 4 is set to $d_1$ while the distance between each two sides adjacent to a second portion Y, which is diagonal to the first portion X, and the inner end of the inner lead portion 4 is set to $d_2$ ($<d_1$). That is, the island portion 3 has a portion 2a for placing the semiconductor chip thereon and an overhang portion 3a attached to that portion.

Figure 5:
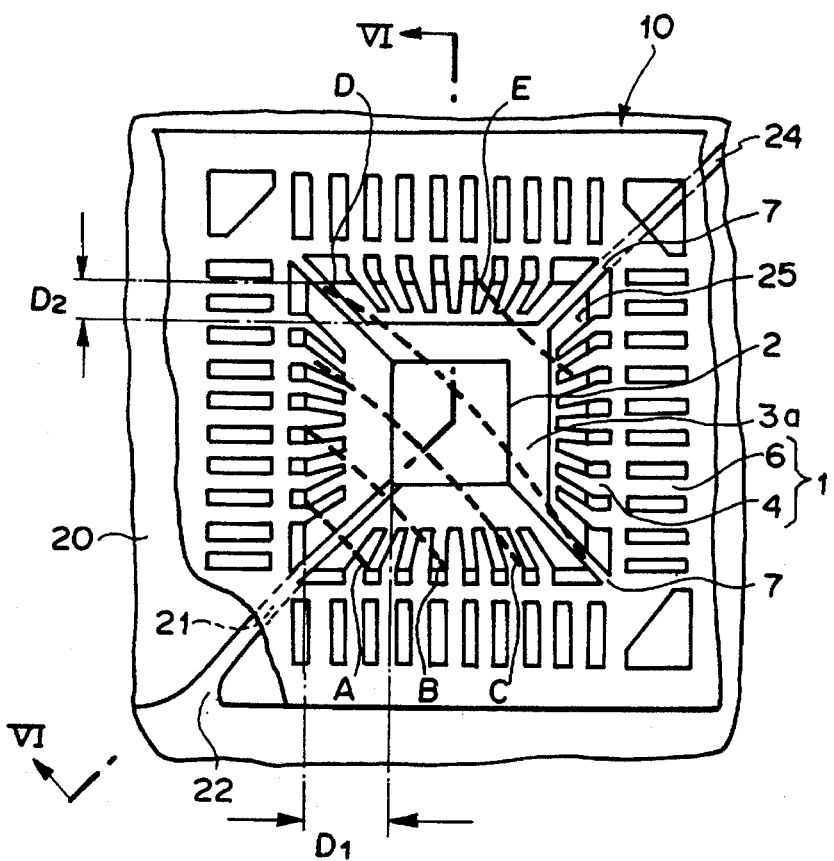
FIG. 5 is a partially cutaway plan view illustrating a positional relationship between the lead frame and a lower mold member.
Figure 6:
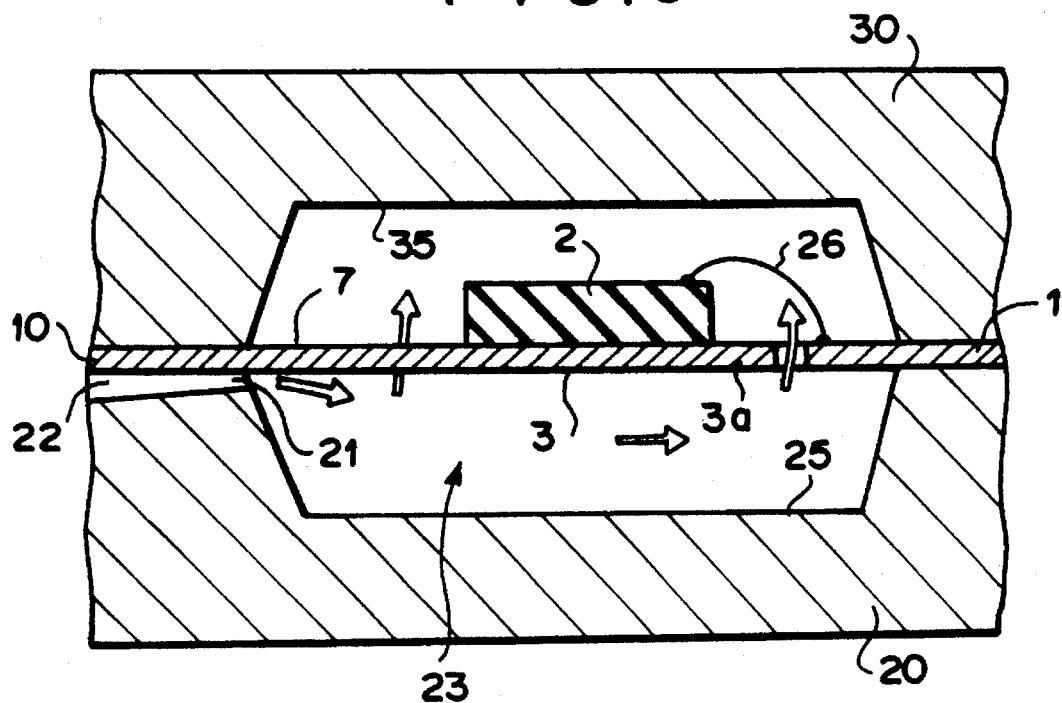
FIG. 6 is a cross-sectional view illustrating a state in which the lead frame is sandwiched by an upper and lower mold members, the cross-sectional view corresponding to one taken along the lines VI—VI of FIG. 5.

In order to manufacture the plastic package type semiconductor device utilizing the lead frame, first, as illustrated in FIGS. 5 and 6, a semiconductor chip 2 is adhered on the island portion 3 of the lead frame 10 with an adhesive agent and each electrode pad of the semiconductor chip and the tip end portion of the inner lead portion 4 of the lead member 1 are interconnected by means of a fine metallic line (bonding wire) 26. Next, the lead frame is attached in position within a mold.

FIG. 5 is a partially cutaway plan view illustrating a positional relationship between the lead frame and a lower mold member. Further, FIG. 6 is a cross-sectional view illustrating a state in which the lead frame is sandwiched by an upper mold member and the lower mold member, the cross-section corresponding to one taken along line VI—VI of FIG. 5.

The mold comprises an upper mold member 30 and a lower mold member 20, both of which cooperate to clamp the lead frame 10 in a sandwiching manner. Thus, a cavity 23 can be formed enveloping the island portion 3 attached with the semiconductor chip is attached and the inner lead portion lying thereabout up to its midway position. That is, a recess portion 25 is formed at the upper surface of the lower mold member 20 and, corresponding thereto, a recess portion 35 is formed at the lower surface of the upper mold member 30, these two recess portions 25, 35 cooperating to form the cavity 23.

At the upper surface of the lower mold member 20, a gate 21 and a runner 22 are formed to inject resin into the cavity 23. The gate 21 is provided at a position corresponding to a first portion X of the island portion 3, from which a molten resin is injected into the cavity 23 in the diagonal direction of the square island portion. At a position corresponding to the gate 21, that is, a position corresponding to a second portion Y of the island portion 3, an air vent 24 is formed to evacuate the air within the cavity as the resin is injected.

The semiconductor chip 2 is joined on the island portion 3 for placing the same thereon so as to lie at the center of the cavity 23. Therefore, the distance $D_2$ between the side portion of the outer periphery of the island portion (that is, the side portion of the overhang portion 3a), which is adjacent to the second portion Y, and the lateral surface of the recess portion of the mold member is smaller than the distance $D_1$ between the side portion of the outer periphery of the island portion, which is adjacent to the first portion X, and the lateral surface of the recess portion of the mold member. Additionally, as described in the above, the overhang portion 3a is closer to the inner end of the inner lead portion 4 than the side portion of the outer periphery of the island portion which is adjacent to the first portion X. Thus, the area of an aperture which communicates two portions of the cavity 23, which are upper and lower than the lead frame, is small at the overhang portion 3a.

Figure 7:
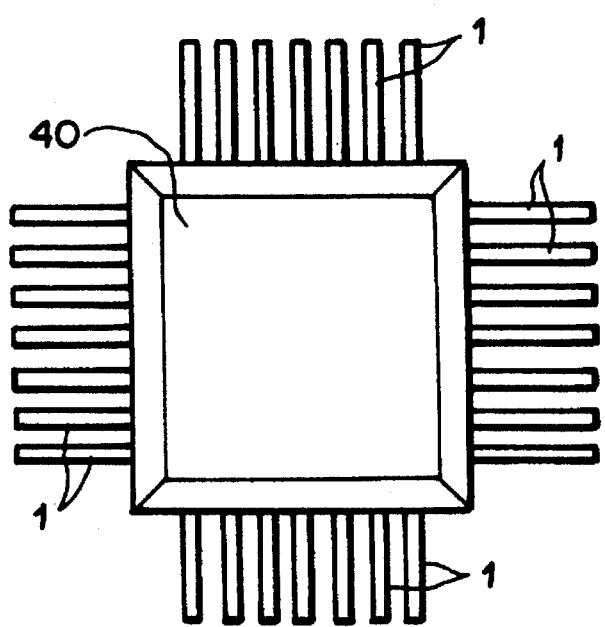
FIG. 7 is a plan view of a plastic package type semiconductor device.

With the lead frame of the present invention as described above, injecting a synthetic sealing resin through the runner 22 and gate 21 into the cavity 23 causes air remaining within the cavity to be evacuated through the air vent 24 by the action of the injected resin. Thus, the resin is filled within the cavity 23 and, subsequently, by heating the mold, the resin is hardened. Finally, the mold are open, the tie bar 8 is cut away, the outer lead portion 6 and the suspension lead 7 are cut apart from the frame portion 5 and the resin burrs are removed to obtain the plastic package type, i.e. resin seal type, semiconductor device as shown in FIG. 7. In FIG. 7, 40 denotes a hardened sealing resin.

Figure 1:
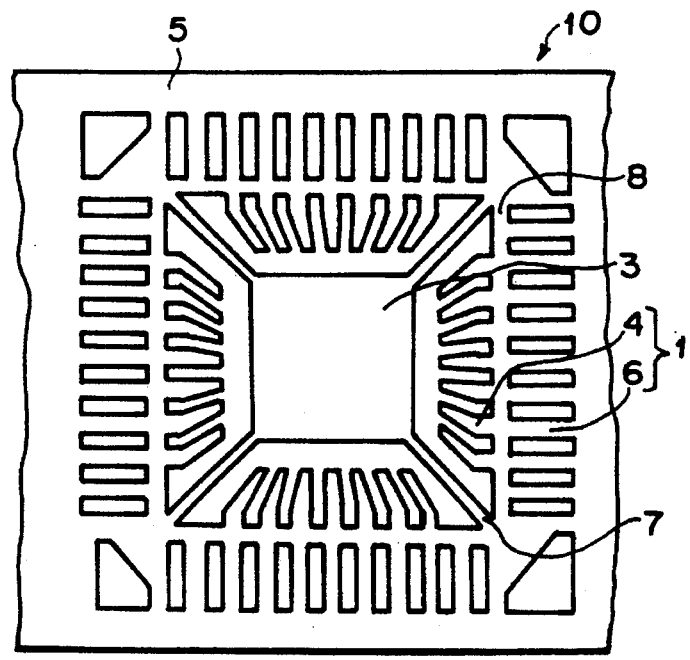
FIG. 1 is a plan view illustrating a specific example of a lead frame used for a conventional plastic package type semiconductor device.
Figure 2:
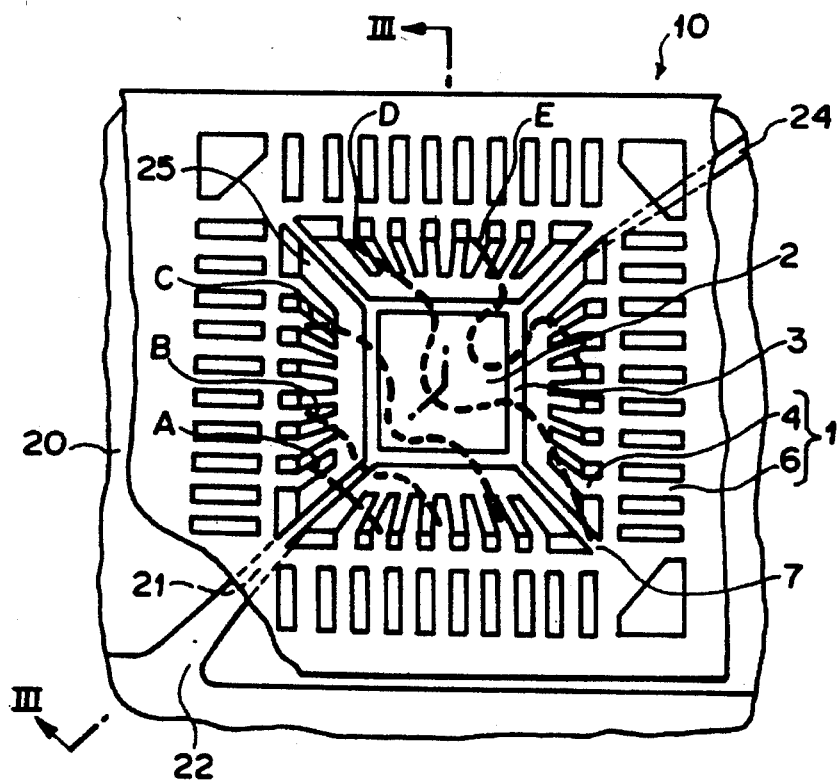
FIG. 2 is a partially cutaway plan view illustrating a positional relationship between the lead frame and a lower mold member.
Figure 3:
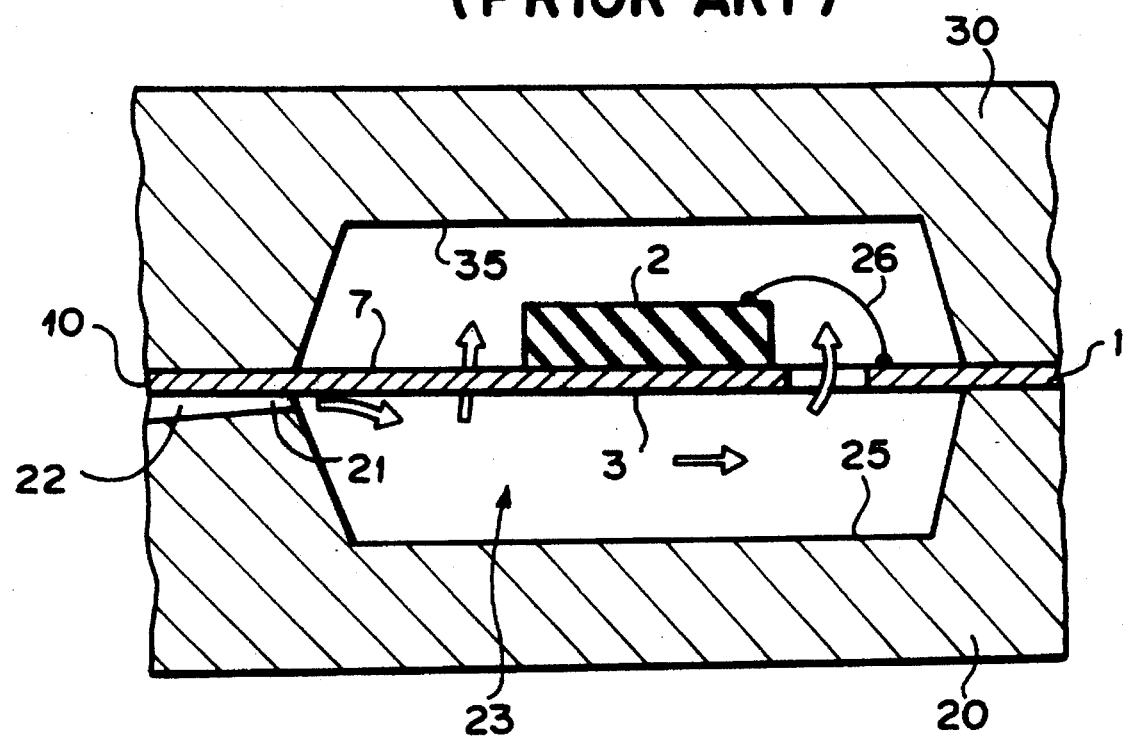
FIG. 3 is a cross-sectional view illustrating a state in which the lead frame is sandwiched by an upper and lower mold members, the cross-sectional view corresponding to one taken along the line III—III of FIG. 2.

In the foregoing embodiment, when the resin is injected into the cavity 23, the molten resin injected from the gate 21 into the lower portion of the cavity 23 under the lead frame 10 will flow to the upper portion of the cavity 23 over the entire periphery of the island portion 3 (indicated by arrow in FIG. 6) while a flow rate of the resin will differ with the aperture at the two sides adjacent to the first portion X (that is, the upstream side relative to the direction in which the resin is injected) and with the aperture at the two sides adjacent to the second portion Y (that is, the downstream side relative to the direction in which the resin is injected). That is, since a width of the aperture is large at the upstream side, the resistance to flow is small and the upward flow rate of resin is relatively great while, at the downstream, since the overhang portion 3a is present, the width of the aperture is small, so that the resistance to flow is great and the upward flow rate of resin is relatively small. As a result, the resin runs over the lead frame in such a manner of A→B→C→D→E as indicated in FIG. 5. That is, the resin first arrives at A, then B, then C, then D and then E. This shows that, unlike the conventional one of FIG. 2, a substantially parallel and even resin flow can also be achieved at the upper portion of the cavity 23, i.e. a portion between the semiconductor chip 2 and the upper mold member 30, from the first portion X toward the second portion Y. Thus, since the air cannot remain involved within the injected resin above the semiconductor chip 2 and, after the resin is hardened, it cannot remain within the hardened resin in the form of air bubbles, the operational cellability of the semiconductor device can excellently be maintained while its mechanical strength can also excellently be maintained.

Figure 8:
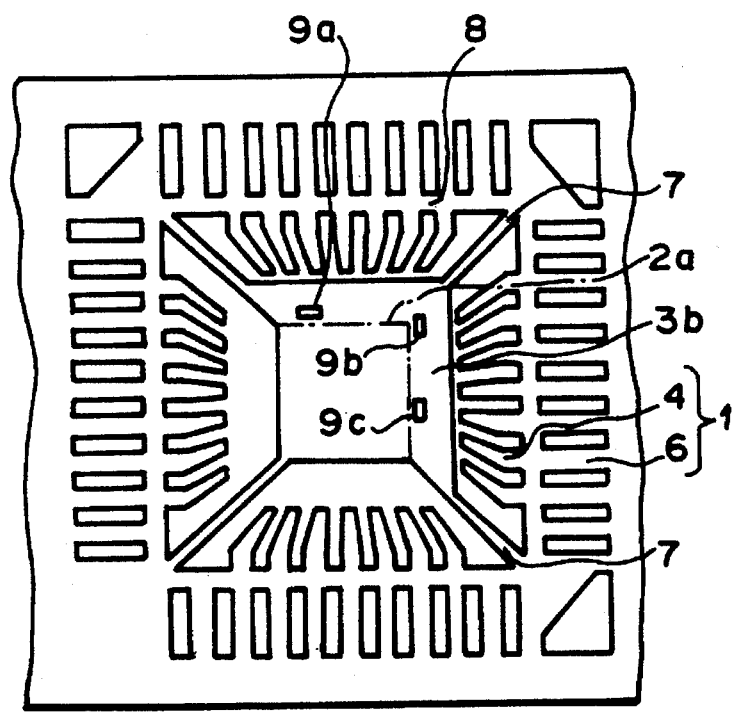
FIG. 8 is a plan view illustrating a second embodiment of the lead frame used for a plastic package type semiconductor device according to the present invention.

FIG. 8 is a plan view illustrating a second embodiment of the lead frame used for the plastic package type semiconductor device according to the present invention, in which members having a function similar to those of FIGS. 4 through 7 are each assigned with the same signs. In this embodiment, markings 9a, 9b, 9c are provided on the island portion 3, which serve as measures for accurately indicating the portion 2a for placing the semiconductor chip thereon to position the same. These markings can be formed simultaneously when a lead frame pattern is formed by etching without requiring any special process.

Figure 9:
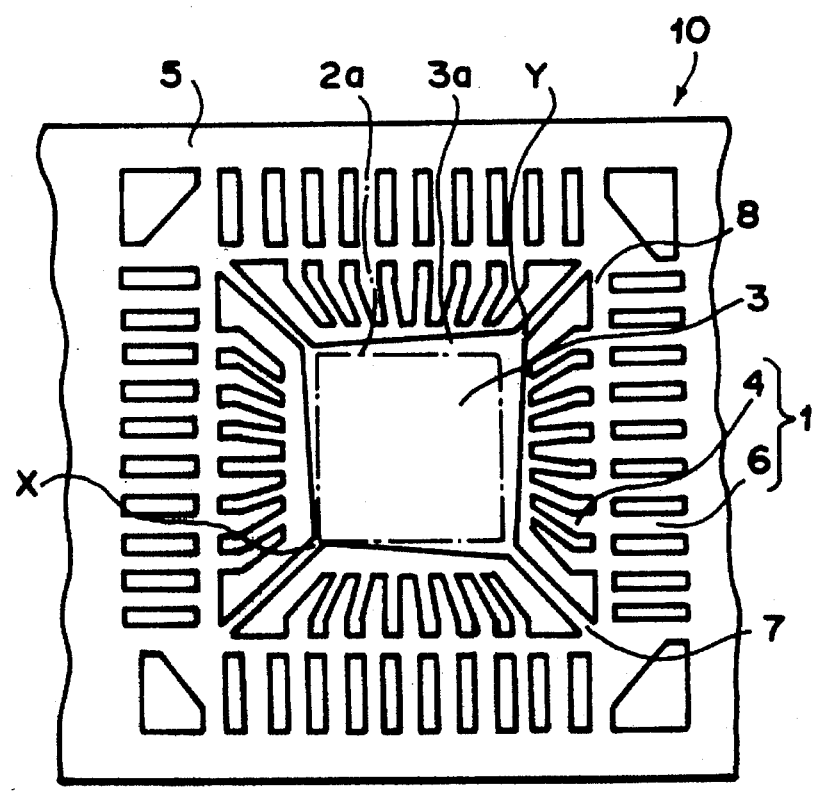
FIG. 9 is a plan view illustrating a third embodiment of the lead frame used for the plastic package type semiconductor device according to the present invention.

FIG. 9 is a plan view illustrating a third embodiment of the lead frame used for the plastic package type semiconductor device according to the present invention, in which members having a function similar to those of FIGS. 4 through 8 are each assigned with the same sign.

In this embodiment, the distance between the outer periphery of the island portion 3 and the inner end of the lead member 1 (that is, the tip end of the inner lead portion 4) is continuously made smaller ranging from the first portion X up to the second portion Y of the island portion 3. Therefore, the overhang portion 3a is present over the almost entire periphery of the island portion 3, and a width hereof is continuously changed.

In the lead frame according to the present invention, in order to make the distance between the island portion and the inner end of the lead member ranging from the first portion up to the second portion of the island portion, it may be made smaller step by step as shown in the first and second embodiments, or may be made continuously smaller as shown in the third embodiment, or further, both of them may be properly used together, as desired.

It should not be understood that the present invention is restricted to the foregoing embodiments, but it is intended to include all the embodiments following the technical ideas represented by the descriptions of the claims that follow.

What is claimed is:

1. A lead frame, comprising:

a rectangular semiconductor chip placing portion for receiving a semiconductor chip thereon;

a first suspension lead, one end of which is connected to a first corner of said semiconductor chip placing portion;

a second suspension lead, one end of which is connected to a second corner of said semiconductor chip placing portion, said second corner being located diagonally across said chip placing portion with respect to said first corner;

a frame portion surrounding said semiconductor chip placing portion, wherein an opposite end of said first suspension lead and an opposite end of said second suspension lead are each connected to said frame portion to support said semiconductor chip placing portion via said first suspension lead and said second suspension lead;

a plurality of lead members extending from said frame portion toward said semiconductor chip placing portion, wherein inner ends of said lead members define a rectangle and, a diagonal of said rectangle and a diagonal of said semiconductor chip placing portion overlap each other, said lead frame being utilized in a process for manufacturing a plastic package type semiconductor device in which process a semiconductor chip is mounted on said semiconductor chip placing portion, said lead frame being sandwiched by a pair of mold members defining a cavity, a mold resin gate for injecting molten plastic into a cavity formed between said mold members, said gate being located on one of said mold members at a position corresponding to said first suspension lead; and two overhanging portions attached to an outer periphery of said semiconductor chip placing portion at two sides adjacent to said second corner, each of said overhanging portions extending toward said inner ends of said lead members so as to have a constant width along each of said sides.

2. A lead frame as set forth in claim 1, wherein a distance between an outer periphery of said overhanging portions and said inner ends of said lead members is less than a distance between said sides adjacent to said second corner and said inner ends of said lead members.

3. A lead frame as set forth in claim 1 further comprising a mark for indicating a boundary between said semiconductor chip placing portion and said overhanging portions.

4. A lead frame as set forth in claim 1, wherein said semiconductor chip placing portion and said overhanging portions form an island portion, and a center of said island portion is shifted from a center of said rectangle toward said second corner.

5. A lead frame, comprising:
   a rectangular semiconductor chip placing portion for receiving a semiconductor chip thereon;
   a first suspension lead, one end of which is connected to a first corner of said semiconductor chip placing portion;
   a second suspension lead, one end of which is connected to a second corner of said semiconductor chip placing portion, said first and second corners being diagonally opposite each other across said semiconductor chip placing portion;
   a frame portion surrounding said semiconductor chip placing portion, wherein an opposite end of said first suspension lead and an opposite end of said second suspension lead are each connected to said frame portion to support said semiconductor chip placing portion via said first suspension lead and said second suspension lead;
   a plurality of lead members extending from said frame portion toward said semiconductor chip placing portion, wherein inner ends of said lead members define a rectangle and, a diagonal of said rectangle and a diagonal of said semiconductor chip placing portion overlap each other, said lead frame being utilized in a process for manufacturing a plastic package type semiconductor device in which process a semiconductor chip is mounted on said semiconductor chip placing portion, said lead frame being sandwiched by a pair of mold members defining a cavity, a gate for injecting molten resin into said cavity mold members at a position corresponding to said first suspension lead;
   two first overhanging portions attached to an outer periphery of said semiconductor chip placing portion at two first sides adjacent to said first corner, each of said first overhanging portions extending toward said inner ends of said lead members so that a width along each of said first sides gradually increases in a direction going away from said first corner; and
   two second overhanging portions attached to an outer periphery of said semiconductor chip placing portion at two second sides adjacent to said second corner, each of said second overhanging portions extending toward said inner ends of said lead members so that a width along each of said second sides gradually decreases in a direction going away from said second corner.

6. A lead frame as set forth in claim 5, wherein a distance between an outer periphery of said first and second overhanging portions and said inner ends of said lead members gradually decreases in a direction going along said first and second sides from said first corner to said second corner.

7. A lead frame as set forth in claim 5 further comprising a mark for indicating a boundary between said semiconductor chip placing portion and said first and second overhanging portions.

8. A lead frame as set forth in claim 5, wherein said semiconductor chip placing portion and said first and second overhanging portions form an island portion, and a center of said island portion is shifted from a center of said rectangle toward said second corner.

9. A lead frame, comprising:
   a rectangular semiconductor chip placing portion for receiving a semiconductor chip thereon;
   a first suspension lead, one end of which is connected to a first side of said semiconductor chip placing portion;
   a second suspension lead, one end of which is connected to a second side of said semiconductor chip placing portion, said second side being opposite to said first side;
   a frame portion surrounding said semiconductor chip placing portion, wherein an opposite end of said first suspension lead and an opposite end of said second suspension lead are each connected to said frame portion to support said semiconductor chip placing portion via said first suspension lead and said second suspension lead;
   a plurality of lead members extending from said frame portion toward said semiconductor chip placing portion, wherein inner ends of said lead members define a rectangle and, a diagonal of said rectangle and a diagonal of said semiconductor chip placing portion overlap each other, said lead frame being utilized in a process for manufacturing a plastic package type semiconductor device, a semiconductor chip being mounted on said semiconductor chip placing portion, a cavity for receiving said lead frame defined by a pair of mold members, a gate for injecting molten resin into a cavity, said gate being formed between said mold members on one of said mold members at a position corresponding to said first suspension lead; and
   three overhanging portions attached to an outer periphery of said semiconductor chip placing portion at said second side and two sides adjacent to said second side, each of said overhanging portions extending toward said inner ends of said lead members so as to have a constant width along each of said second side and said two sides.

10. A lead frame as set forth in claim 9, wherein a distance between an outer periphery of said overhanging portions and said inner ends of said lead members is less than distance between said first side and said inner ends of said lead members.

11. A lead frame as set forth in claim 9 further comprising a mark for indicating a boundary between said semiconductor chip placing portion and said overhanging portions.

12. A lead frame as set forth in claim 9, wherein said semiconductor chip placing portion and said overhanging portions form an island portion, and a center of said island portion is shifted from a center of said rectangle toward said second side.

* * * * *